United States Patent
Takamatsu et al.

(10) Patent No.: US 8,889,803 B2
(45) Date of Patent: Nov. 18, 2014

(54) POLYMERIZABLE EPOXY COMPOSITION, AND SEALING MATERIAL COMPOSITION COMPRISING THE SAME

(75) Inventors: Yasushi Takamatsu, Funabashi (JP); Yugo Yamamoto, Chiba (JP); Yuichi Ito, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 86 days.

(21) Appl. No.: 12/864,418

(22) PCT Filed: Jan. 23, 2009

(86) PCT No.: PCT/JP2009/000264
§ 371 (c)(1),
(2), (4) Date: Jul. 23, 2010

(87) PCT Pub. No.: WO2009/093467
PCT Pub. Date: Jul. 30, 2009

(65) Prior Publication Data
US 2011/0001419 A1 Jan. 6, 2011

(30) Foreign Application Priority Data
Jan. 25, 2008 (JP) ................................ 2008-015550
Apr. 8, 2008 (JP) ................................ 2008-100355

(51) Int. Cl.
| | | |
|---|---|---|
| *C08G 59/66* | (2006.01) | |
| *C08L 63/00* | (2006.01) | |
| *C08L 63/02* | (2006.01) | |
| *H01L 33/48* | (2010.01) | |
| *C08G 59/22* | (2006.01) | |
| *C09J 163/00* | (2006.01) | |
| *C08G 59/38* | (2006.01) | |
| *C08G 59/40* | (2006.01) | |
| *H01L 51/52* | (2006.01) | |

(52) U.S. Cl.
CPC ......... *C08G 59/38* (2013.01); *H01L 2251/5315* (2013.01); *C08L 2203/02* (2013.01); *H01L 51/5237* (2013.01); *C08G 59/226* (2013.01); *C08L 63/00* (2013.01); *C08G 59/66* (2013.01); *C09J 163/00* (2013.01); *C08G 59/4064* (2013.01)
USPC ............ 525/524; 257/100; 525/525; 528/109

(58) Field of Classification Search
None
See application file for complete search history.

(56) References Cited

U.S. PATENT DOCUMENTS

| | | | | |
|---|---|---|---|---|
| 4,707,534 | A | * | 11/1987 | Schultz ............................ 528/97 |
| 6,913,798 | B2 | | 7/2005 | Kitamura et al. |
| 2002/0022713 | A1 | | 2/2002 | Tanaka et al. |
| 2002/0176046 | A1 | | 11/2002 | Kitamura et al. |
| 2003/0149230 | A1 | | 8/2003 | Tanaka et al. |
| 2003/0199668 | A1 | | 10/2003 | Tanaka et al. |
| 2006/0208219 | A1 | | 9/2006 | Imaizumi et al. |
| 2007/0096056 | A1 | | 5/2007 | Takeuchi et al. |
| 2009/0029153 | A1 | * | 1/2009 | Naito et al. ................... 428/328 |

FOREIGN PATENT DOCUMENTS

| | | | |
|---|---|---|---|
| JP | 10-60397 | A | 3/1998 |
| JP | 10-130250 | A * | 5/1998 |
| JP | 11-45778 | A | 2/1999 |

(Continued)

OTHER PUBLICATIONS

Chen et al., "New Epoxy Resins. II. The Preparation, Characterization, and Curing of Epoxy Resins and Their Copolymers," Journal of Applied Polymer Science, vol. 27, 1982, pp. 3289-3312.*

(Continued)

*Primary Examiner* — Robert Sellers
(74) *Attorney, Agent, or Firm* — Buchanan, Ingersoll & Rooney PC

(57) ABSTRACT

To provide an epoxy polymerizable composition which exhibits low curing shrinkage and high workability and which gives a cured article having a high refraction index and high heat resistance. The epoxy polymerizable composition contains (A2) fluorene epoxy compound having the following general formula (1) or (2), (A3) epoxy compound having a softening point of 30° C. or less, and (B1) thiol compound having two or more thiol groups in one molecule.

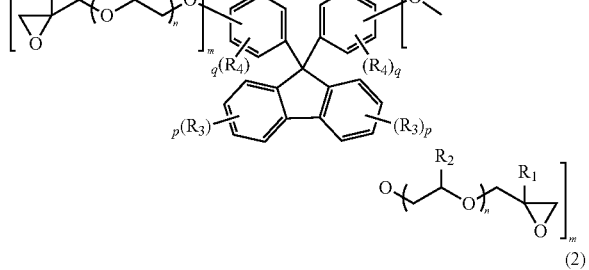

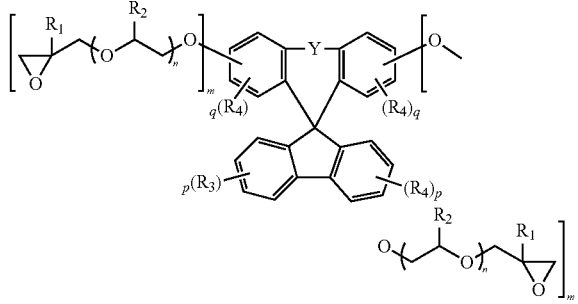

11 Claims, 1 Drawing Sheet

(56) References Cited

FOREIGN PATENT DOCUMENTS

| | | | |
|---|---|---|---|
| JP | 2-270869 A | | 11/1999 |
| JP | 2001-206862 A | | 7/2001 |
| JP | 2001-342252 | | 12/2001 |
| JP | 2001-357973 A | | 12/2001 |
| JP | 2004-35857 A | | 2/2004 |
| JP | 2004-168945 A | | 6/2004 |
| JP | 2005-41925 A | * | 2/2005 |
| JP | 2005-89595 A | | 4/2005 |
| JP | 2005-314692 A | * | 11/2005 |
| JP | 2006-228708 | | 8/2006 |
| JP | 2007-154160 A | * | 6/2007 |
| WO | WO 01/98411 A1 | | 12/2001 |
| WO | WO 2004/090621 A1 | | 10/2004 |
| WO | WO 2005/052021 A1 | | 6/2005 |

OTHER PUBLICATIONS

International Search Report (PCT/ISA/210) dated Mar. 10, 2009.
Extended European Search Report issued Oct. 29, 2012, in corresponding European Application No. 09704686.6-1214.
Machine English translation of JP 2005-041925 A, Feb. 17, 2005.
Office Action dated Sep. 23, 2013, issued by the European Patent Office in the corresponding European Application No. 09704686.6. (7 pages).
Pham et al., "Epoxy Resins", Jan. 1, 2004, Encyclopedia of Polymer Science and Technology, vol. 9, pp. 1-127. XP007920796.

* cited by examiner

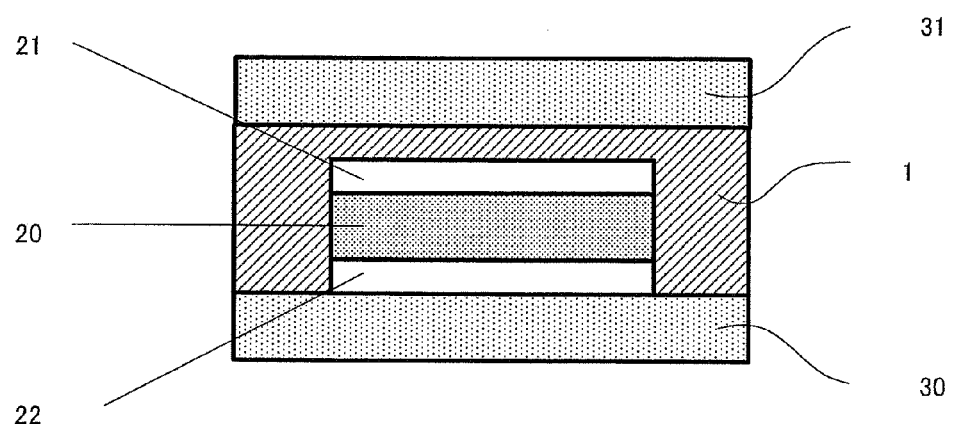

POLYMERIZABLE EPOXY COMPOSITION, AND SEALING MATERIAL COMPOSITION COMPRISING THE SAME

TECHNICAL FIELD

The present invention relates to an epoxy polymerizable composition, a transparent resin for optical materials containing the same, a sealant composition containing the same, and an optical device containing a sealant prepared from a cured article of the sealant composition.

BACKGROUND ART

For their lower power consumption and less view-angle dependence, organic EL (electroluminescent) displays have been expected to become next-generation displays or luminescent devices, but have the problem of being susceptible to degradation by moisture or oxygen in the atmosphere. To overcome this drawback, organic EL devices in the display panel are sealed with a sealing member.

Currently, there are two different sealing methods of organic EL devices: a method called "frame sealing," and a method called "cover sealing." Frame sealing refers to a method in which a sealing cap is placed above organic EL devices formed on the substrate and a sealing material is applied around the periphery of the sealing cap in such a way as to seal in the organic EL devices (see, e.g., Patent Document 1). The sealing cap is a plate-like member of certain shape, such as a glass plate or stainless steel plate. This method is less productive because processing of a plate-like member is highly laborious. Moreover, the sealing cap is susceptible to curling due to the presence of space between the sealing cap and the organic EL devices. Thus, unfortunately, the frame sealing method has been less applicable to the manufacture of larger organic EL panels.

Cover sealing, a method which may overcome the above-described problem associated with frame sealing, refers to a method in which a sealant composition is applied in the space between the sealing plate and substrate and between the sealing plate and organic EL devices, thereby encapsulating the organic EL devices with the sealant composition (see, e.g., Patent Document 2). This method has the advantages of being highly productive as it can dispense with providing a sealing cap, as well as avoiding curling of the sealing plate as no space is left under the sealing plate.

Sealants used for cover sealing need to have high refraction indices (the difference in refraction index between the sealant and transparent cathode electrode should be small) because they are applied in a space formed between organic EL devices and sealing plate. This particularly applies to top emission devices. The reason for this is that when the sealant used has a low refraction index, total light reflection occurs between the cathode and the sealant thus resulting in low light extraction efficiency in the organic EL devices.

It is also required that sealant compositions from which sealants for cover sealing are made exhibit small curing shrinkage. This is because high curing shrinkage leads to generation of small gaps between the cured sealant and substrate due to internal stress, which in turn reduces adhesion and moisture impermeability.

Moreover, sealants directed to cover sealing are required to have a certain level of heat resistance because low heat resistance results in less reliable organic EL panels.

It is also required that sealant compositions for the sealants for cover sealing be liquid around room temperature. If the sealant composition is not liquid around room temperature, it results in the inconvenience of having to melt the sealant composition by heating upon sealing of organic EL devices. Heat treatment causes strains in the display parts and thus sufficient sealing may fail. Moreover, heat treatment promotes curing reactions in the sealant composition thus facilitating generation of viscosity variations.

As resin compositions suitable for optical applications, epoxy resin compositions are proposed which contain an epoxy resin having a fluorene skeleton, and an acid anhydride (see, e.g., Patent Document 3). These epoxy resin compositions are considered to have high heat resistance as well as high transparency for the presence of the fluorene skeleton in the molecular structure of the epoxy resin. From their compositions, they are considered to give a cured article having a refraction index as high as about 1.63. These epoxy resin compositions, however, have high softening points and thus are solid at room temperature; therefore, the use of the epoxy resin compositions as sealant compositions has met with the problem of poor workability.

As adhesive compositions suitable for bonding of optical parts, photocurable adhesive compositions have been proposed which contain a thiol compound and an epoxy compound (see, e.g., Patent Document 4). These photocurable adhesive compositions are considered to have high refraction indices for their high sulfur content. Further, the photocurable adhesive compositions have high softening points because they are free from any rigid molecular structure like fluorene skeleton, thus exhibiting excellent workability at room temperature. Unfortunately, however, they have met with the problem of low heat resistance.

As resins suitable for lens applications, sulfur-containing urethane resins are proposed which contain a polyisocyanate compound and a thiol compound (see, e.g., Patent Document 5). After cured, these sulfur-containing urethane resins are considered to have high refraction indices for their high sulfur content, as well as a certain level of heat resistance for the presence of the polyisocyanate compound. Moreover, for their low softening point, the sulfur-containing urethane resins are considered to exhibit excellent workability at room temperature. However, unlike epoxy resins, the sulfur-containing urethane resins show large curing shrinkage when cured and thus are not suitable for applications including sealants.

Optical instruments and precision instruments, including liquid crystal displays, suffer a breakdown or device degradation due to moisture from the atmosphere. Thus, less moisture permeable sealants are proposed which protect these optical devices and precision devices against moisture (see, e.g., Patent Document 6).

[Patent Document 1] Japanese Patent Application Laid-Open No. 11-45778

[Patent Document 2] Japanese Patent Application Laid-Open No. 2001-357973

[Patent Document 3] Japanese Patent Application Laid-Open No. 2005-41925

[Patent Document 4] Japanese Patent Application Laid-Open No. 2004-35857

[Patent Document 5] Japanese Patent Application Laid-Open No. 02-270869

[Patent Document 6] Japanese Patent Application Laid-Open No. 10-60397

DISCLOSURE OF INVENTION

Problems to be Solved by the Invention

As described above, among other sealants, sealants used for cover sealing of organic EL devices, particularly top emission organic EL devices, are required to have high refraction indices and high heat resistance. Moreover, resin compositions from which such sealants are made are required to exhibit both low curing shrinkage and high workability. Currently, however, sealants or resin compositions for preparing the sealants which can meet the above requirements have not yet been proposed. It is therefore an object of the present invention to provide a resin composition which exhibits low curing shrinkage and high workability as well as gives a cured article having high refraction index and high heat resistance, particularly a resin composition which exhibits high workability and gives a cured article having high heat resistance.

Sealants used for sealing devices of optical or precision instruments, particularly sealants used for cover sealing of organic EL display devices (particularly top emission organic EL devices), are required to have high refraction indices and low moisture permeability. However, the current situation is that sealants and resin compositions for preparing the sealants which can meet the above requirements have not yet been proposed. It is therefore another object of the present invention to provide a composition which can give a cured article having low moisture permeability, high refraction index, and high heat resistance, particularly a composition which can give a cured article having low moisture permeability and high refraction index.

Means for Solving the Problem

The inventors conducted extensive studies and finally established that the above-problems can be solved using epoxy polymerizable compositions containing an epoxy compound having a specific skeleton and a specific thiol compound. A first aspect of the present invention relates to epoxy polymerizable compositions, transparent resins for optical materials containing the same, cured articles prepared from the same, etc., described below.

[1] An epoxy polymerizable composition including:
(A2) fluorene epoxy compound having the following general formula (1) or (2);
(A3) epoxy compound having a softening point of 30° C. or less; and
(B1) thiol compound having two or more thiol groups in one molecule.

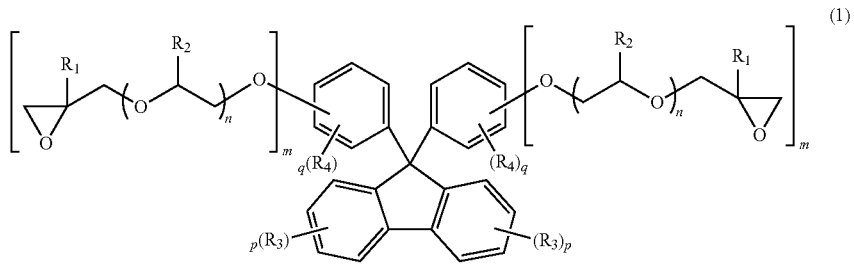

(1)

where $R_1$s independently represent hydrogen atom or methyl group; $R_2$s independently represent hydrogen atom or methyl group; $R_3$s independently represent alkyl group having 1-5 carbon atoms; $R_4$s independently represent alkyl group having 1-5 carbon atoms; ns independently represent an integer of 0-3; ms independently represent an integer of 1-3; ps independently represent an integer of 0-4; and qs independently represent an integer of 0-4.

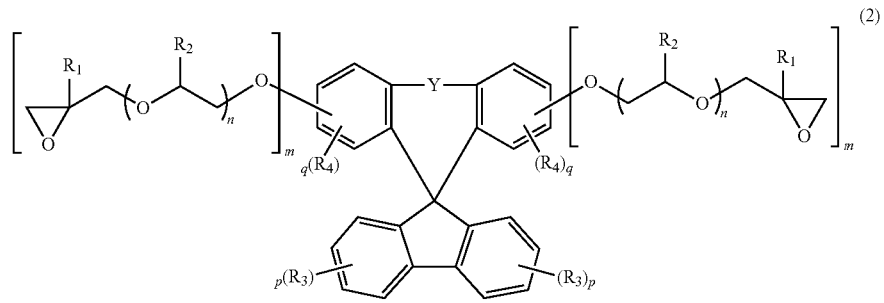

(2)

where Y represents single bond, oxygen atom or sulfur atom; and $R_1$-$R_4$, m, n, p and q are defined the same as those of general formula (1).

[2] The epoxy polymerizable composition according to [1], wherein the epoxy polymerizable composition has a viscosity 25° C. of 0.1-100 Pa·s, as measured with an E-type viscometer.

[3] The epoxy polymerizable composition according to [1] or [2], wherein (B1) thiol compound has a thiol equivalent weight of 80-100 g/eq and a sulfur content of 50-80%.

[4] The epoxy polymerizable composition according to any one of [1] to [3], wherein (B1) thiol compound has a thiol equivalent weight of 85-95 g/eq and a sulfur content of 60-75%.

[5] The epoxy polymerizable composition according to any one of [1] to [4], wherein (A3) epoxy compound is a bisphenol epoxy compound.

[6] The epoxy polymerizable composition according to any one of [1] to [5], wherein (A3) epoxy compound is contained in an amount of 20-70 parts by weight per 100 parts by weight of (A2) fluorene epoxy compound.

[7] The epoxy polymerizable composition according to any one of [1] to [6], wherein (B1) thiol compound has a molecular weight of 140-500.

[8] A transparent resin for optical materials including the epoxy polymerizable composition according to any one of [1] to [7].

[9] A sealant composition formed of the epoxy polymerizable composition according to any one of [1] to [7].

[10] A cured article formed by curing the transparent resin according to [8].

[11] The cured article according to [10], wherein the cured article has a refraction index of 1.64 or greater.

[12] A method of producing the epoxy polymerizable composition according to any one of [1] to [7], including:

mixing (A2) fluorene epoxy compound and (A3) epoxy compound under heating to form an epoxy compound mixture; and mixing the epoxy compound mixture and (B1) thiol compound at 30° C. or less.

A second aspect of the present invention relates to epoxy polymerizable compositions, transparent resins for optical materials containing the same, cured articles prepared from the same, etc.

[13] An epoxy polymerizable composition including:

(A1) epoxy compound having two or more epoxy groups in one molecule;

(B2) thiol compound having four or more thiol groups in one molecule; and (C) curing promoter.

[14] The epoxy polymerizable composition further including (D) silane coupling agent.

[15] The epoxy polymerizable composition according to [13] or [14], wherein (B2) thiol compound has a thiol equivalent weight of 80-100 g/eq.

[16] The epoxy polymerizable composition according to any one of [13] to [15], wherein (A1) epoxy compound is a fluorene epoxy compound.

[17] The epoxy polymerizable composition according to any one of [14] to [16], wherein per 100 parts by weight of (B2) thiol compound, (A1) epoxy compound is added in an amount of 100-300 parts by weight;

(C) curing promoter is added in an amount of 0.02-40 parts by weight; and (D) silane coupling agent is added in an amount of 0.02-40 parts by weight, and wherein the molar ratio of epoxy group to thiol group is 1:0.9-1:1.

[18] The epoxy polymerizable composition according to any one of [13] to [17], wherein (B2) thiol compound has a molecular weight of 140-500.

[19] A transparent resin for optical materials including the epoxy polymerizable composition according to any one of [13] to [18].

[20] A sealant composition formed of the epoxy polymerizable composition according to any one of [13] to [18].

[21] A cured article formed by curing the transparent resin according to [19].

[22] The cured article according to [21], wherein the cured article has a refraction index of 1.64 or greater.

[23] The cured article according to [21] or [22], wherein the cured article, when formed as a 100 μm-thick cured article, has a moisture permeability of 20 g/m$^2$/24 h or less as measured in accordance with JIS Z0208 at 60° C. at 90% RH, and wherein (B2) thiol compound has a sulfur content of 50-80%.

A third aspect of the present invention relates to optical devices and organic EL panels described below.

[24] An optical device including the cured article according to any one of [10], [11] and [21] to [23].

[25] An organic EL panel including:

a display substrate having organic EL devices arranged thereon;

a counter substrate which pairs with the display substrate; and a sealant which is provided between the display substrate and the counter substrate and fills a space formed between the organic EL devices and the counter substrate, wherein the sealant is the cured article according to any one of [10], [11] and [21] to [23].

[26] The organic EL panel according to [25], wherein the organic EL devices are top emission organic EL devices.

Advantageous Effect Of The Invention

Epoxy polymerizable compositions provided by the present invention exhibit low curing shrinkage and high workability. By sealing optical devices, particular top emission organic EL devices, using the epoxy polymerizable compositions, it is possible to improve the light extraction efficiency.

Further, by sealing top emission organic EL devices using the epoxy polymerizable compositions, it is possible not only to improve the light extraction efficiency, but also to prevent moisture permeation into the device.

BRIEF DESCRIPTION OF DRAWINGS

The drawing is a sectional view showing an example of a cover-sealed organic EL display panel according to the present invention;

BEST MODE FOR CARRYING OUT THE INVENTION

1. Epoxy Polymerizable Composition

Preferably, a cured article of an epoxy polymerizable composition of the present invention is transparent. The cured article is only required to be transparent enough for use as a sealant or optical material through which at least light emitted from the optical device can pass. An epoxy polymerizable composition of the present invention contains (A) epoxy compound, (B) thiol compound, and additional optional component(s) (e.g., (C) curing promoter). The epoxy polymerizable composition of the present invention is of two types as described below.

A first epoxy polymerizable composition of the present invention will be described. The first epoxy polymerizable composition exhibits high workability at room temperature as well as gives a cured article having a high refraction index. The first epoxy polymerizable composition contains (A2) fluorene epoxy compound having general formula (1) or (2), (A3) epoxy compound having a softening point of 30° C. or less, and (B1) thiol compound having two or more thiol groups in one molecule.

(A2) Fluorene Epoxy Compound

A fluorene epoxy compound can increase the refraction index of a cured article of a resin composition containing the fluorene epoxy compound. Moreover, since the fluorene is a rigid aromatic group, a cured article of a resin composition containing a fluorene epoxy compound is considered to show increased heat resistance.

Preferably, the fluorene epoxy compound has a softening point of 50-200° C., more preferably 80-160° C., in order to increase the composition's workability and heat resistance of the cured article.

The fluorene epoxy compound has the following general formula (1) or (2):

ing value of "n" to enhance the resultant resin composition's workability, as will be demonstrated later. However, when a value of n is too large, the cured article may show low heat resistance. Thus, n is preferably 0 or 1.

In general formula (1), the two ms represent the number of epoxy-containing substituents, independently representing an integer of 1-3. As used herein, the term "epoxy-containing substituent" means a substituent containing an epoxy group, which is attached to a benzene ring. When a value of m is large, the cured article has high heat resistance, but curing shrinkage may become too large. Thus, m is preferably 1.

In general formula (1), the two ps represent the number of substituent $R_3$, independently representing an integer of 0-4. When the value of p is large, softening point decreases and thus workability is enhanced, but the heat resistance and refraction index of the cured article may decrease too much. Thus, p preferably represents 0 or 1, more preferably 0. $R_3$s in general formula (1) independently represent alkyl group having 1 to 5 carbon atoms. Higher alkyls lower softening point and thus enhance workability, but may both lower the heat resistance and refraction index of the cured article too much. Thus, $R_3$ is preferably methyl group.

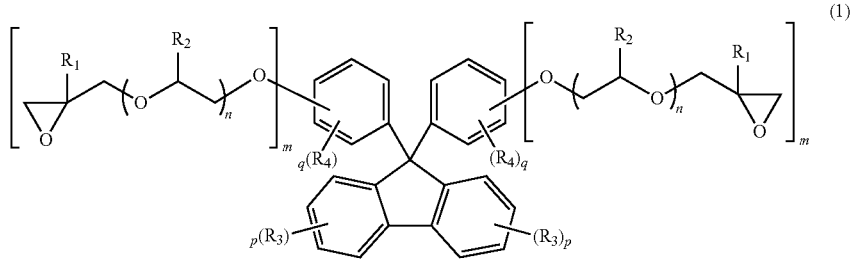

(1)

$R_1$s in general formula (1) independently represent hydrogen atom or methyl group, but are preferably hydrogen atoms for increased epoxy group reactivity. The term "independently represent" means that two or more $R_1$s in the formula may be the same or different. Note that the same applies hereinafter.

$R_2$s in general formula (1) independently represent hydrogen atom or methyl group, but are preferably hydrogen atoms for increased epoxy group reactivity.

In general formula (1), the two ns represent the repeat number of the alkylene ether unit, independently representing an integer of 0-3. The softening point decreases with increas- In general formula (1), the two qs represent the number of substituent $R_4$, independently representing an integer of 0-4. When the value of q is large, softening point decreases and thus workability is enhanced, but the heat resistance and refraction index of the cured article may decrease too much. Thus, q preferably represents 0 or 1, more preferably 0. $R_4$s in general formula (1) independently represent alkyl group having 1 to 5 carbon atoms. Higher alkyls lower softening point and thus enhance workability, but may lower both heat resistance and refraction index of the cured article too much. Thus, $R_4$ is preferably methyl group.

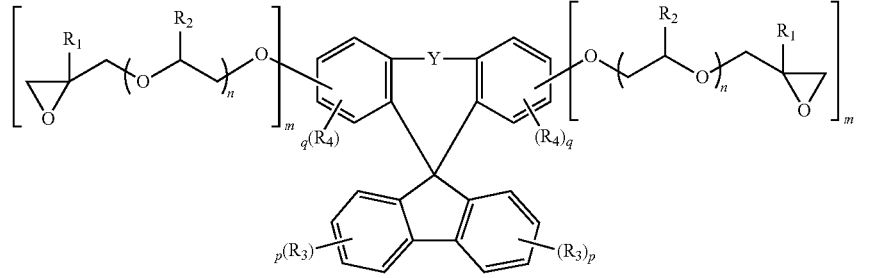

(2)

Y in general formula (2) represents a single bond, oxygen atom, or sulfur atom. $R^1$-$R^4$, m, n, p, and q in general formula (2) are defined the same as those of general formula (1).

Compounds having general formula (2) have more rigid molecular structures than those having general formula (1). Thus, cured articles of the compounds having general formula (2) exhibit high heat resistance. In particular, where Y represents a single bond, the cured article exhibits remarkably high heat resistance, but softening point may become too high to reduce workability. On the other hand, where Y represents oxygen atom or sulfur atom, the cured article shows a better balance between softening point and workability.

A fluorene epoxy compound can be prepared for instance by reacting a phenol having a fluorene skeleton with epichlorohydrin (also referred to as "3-chloro-1,2-epoxypropane") through a known process. A desired epoxy compound can be prepared by appropriately selecting the structures of both epichlorohydrin and phenol having a fluorene skeleton.

More specifically, $R_1$s in general formula (1) can be appropriately changed using epichlorohydrin derivatives instead of epichlorohydrin. For example, using an epichlorohydrin derivative in which methyl group is attached to the second carbon atom of 3-chloro-1,2-epoxypropane, a fluorene epoxy compound having general formula (1) in which $R_1$ is methyl group can be prepared.

A phenol having a fluorene skeleton can be prepared in accordance with the process disclosed by JP-A No. 2001-206862. By appropriately selecting the phenol structure, m, $R_3$ and p in general formula (1) can be changed.

By using a multifunctional hydroxyl-containing fluorene compound disclosed by Patent Document 3, a fluorene epoxy compound can be prepared in which $R_2$ in general formula (1) is hydrogen atom or methyl group as well as n is not 0.

(A3) Epoxy Compound Having Softening Point of 30° C. or Less

Epoxy compounds having a softening point of 30° C. or less, preferably 25° C. or less, may enhance the workability of epoxy polymerizable compositions. Softening point can be measured with the ring-and-ball method as set forth in JIS K7234.

The epoxy compounds having a softening point of 30° C. or less are not specifically limited, but may be bisphenol epoxy compounds.

The bisphenol epoxy compounds preferably have two or more epoxy groups in their molecule. A cured article from a resin composition containing such a compound exhibits high crosslink density and excellent heat resistance. More preferably, the bisphenol epoxy compounds are compounds having the following general formula (3).

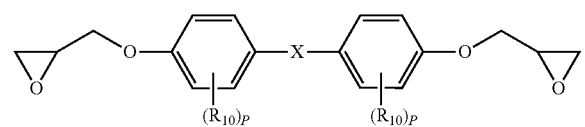

(3)

In general formula (3), X represents a single bond, methylene group, isopropylidene group, —S—, or —$SO_2$—. Bisphenol F epoxy compounds in which X is methylene and bisphenol A epoxy compounds in which X is isopropylidene group are both liquid at room temperature and thus can readily dissolve fluorene epoxy compounds therein. For this reason, they are preferably mixed with fluorene epoxy compounds for use. Among them, bisphenol F epoxy compounds are most preferable.

In general formula (3), p represents the number of substituent $R_{10}$, which is an integer of 0-4. Preferably, p is 0 in view of heat resistance and moisture impermeability. $R_{10}$s independently represent an alkyl group having 1 to 5 carbon atoms, preferably methyl group.

A bisphenol epoxy compound is prepared by reaction between phenol and epichlorohydrin. The structure of the bisphenol epoxy compound prepared is determined by appropriately changing the structure of bisphenol employed.

(B1) Thiol Compound (B1) Thiol compound is characterized by having two or more thiol groups in one molecule. (B1) Thiol compound may acts as a curing agent for (A2) fluorene epoxy compound and (A3) epoxy compound having a softening point of 30° C. or less. Thiol groups in (B1) thiol compound react with epoxy groups of (A2) fluorene epoxy compound or with epoxy groups of (A3) epoxy compound having a softening point of 30° C. or less, allowing the molecules of the two epoxy compounds to crosslink to form a cured article having high heat resistance, adhesion, etc.

Compounds having two or more thiol groups in one molecule are not specifically limited. When the number of thiol groups is large, a resultant cured article of an epoxy compound (hereinafter also simply referred to as a "cured article") exhibits enhanced heat resistance as the crosslink density increases in the cured article. However, when the number of thiol groups is too large, reactivity with epoxy groups decreases because steric hindrance becomes likely to arise as thiol groups are brought close together within a molecule of the thiol compound. On the other hand, when the number of thiol groups is too small, it reduces the cured article's heat resistance. The thiol group content in the molecule is expressed in terms of thiol equivalent weight (g/eq).

(B1) Thiol compound has a thiol equivalent weight of 80-100 g/eq, preferably 85-95 g/eq, more preferably 86-92 g/eq. Thiol equivalent weight refers to a value obtained by dividing the molecular weight of (B1) thiol compound by the number of thiol groups contained in the molecule. When the thiol equivalent weight is less than 80 g/eq, the distances among crosslink points in the cured article become so small that the thiol compound's reactivity with epoxy groups may decrease, which may decrease the epoxy conversion ratio. When the thiol equivalent weight is greater than 100 g/eq, the distances among crosslink points in the cured article become so long that the cured article's heat resistance may decrease.

A thiol compound having sulfur atoms in the molecule increases the refraction index of a cured article of an epoxy polymerizable composition in which it is contained. Thus, the sulfur content of (B1) thiol compound in the epoxy polymerizable composition is 50-80%, more preferably 60-75%. Sulfur content is calculated based on the proportions of elements (the ratio of sulfur to total elements) in the thiol compound as measured by mass spectrometry. A sulfur content of less than 50% may result in insufficient increase in the refraction index of a cured article of a resin composition containing the thiol compound. Many of the thiol compounds having a sulfur content of greater than 80% have S—S bonds in their molecules; therefore, a cured article of a resin composition containing such a high-sulfur content thiol compound may generate radicals or may be chemically unstable.

Preferably, (B1) thiol compound has a molecular weight of 140-500. When the molecular weight is high, the resin composition in which it is contained may exhibit high viscosity or may fail to uniformly cure. Molecular weight may be measured by mass spectrometry.

(B1) Thiol compound is not specifically limited as long as it has a thiol equivalent weight and sulfur content that fall within the above-specified ranges. Non-exclusive specific examples of (B1) thiol compound include compounds having the following formulas (4), (5) and (6). These compounds may be prepared through a known process, but are commercially available as well. The compound having formula (4) has a thiol equivalent weight of 87 g/eq and a sulfur content of 62%; the compound having formula (5) has a thiol equivalent weight of 91 g/eq and a sulfur content of 61%; and the compound having formula (6) has a thiol equivalent weight of 89/eq and a sulfur content of 72%.

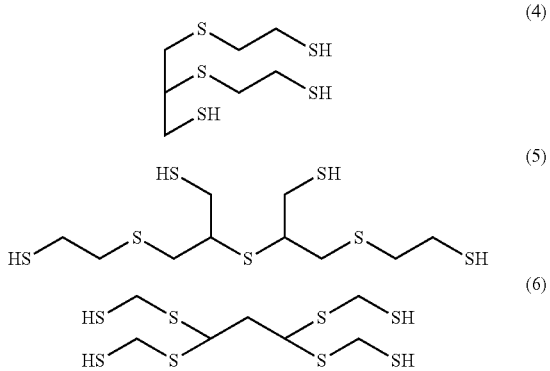

In the first epoxy polymerizable compound, (A3) epoxy compound having a softening point of 30° C. or less is preferably contained in an amount of 20-100 parts by weight, preferably 20-70 parts by weight, per 100 parts by weight of (A2) fluorene epoxy compound. While (A2) fluorene epoxy compound is often solid at room temperature, (A3) epoxy compound having a softening point of 30° C. or less is often liquid at room temperature. In this way the epoxy polymerizable composition's viscosity can be kept within an appropriate range, specifically within 0.1-100 Pa·s.

The (B1) thiol compound content is preferably determined according to the molar ratio between thiol and epoxy groups in the composition, because (B1) thiol compound acts as a curing agent for the epoxy compound. More specifically, when the epoxy polymerizable composition contains an excessive amount of thiol groups, some thiol groups remain unreacted with epoxy groups in the cured article. In this case, when the epoxy polymerizable composition is used for a sealant, it may contaminate members to be sealed. On the other hand, when the thiol content is too low, it results in failure to increase crosslink density to a sufficient level, which may reduce the heat resistance of the resultant cured article.

Thus, it is preferable that thiol group be contained in an amount of 0.9-1.1 moles per 1 mole of epoxy group in the composition, preferably 0.95-1.05 moles, most preferably 1 mole. It should be noted that the proportions of (A2), (A3) and (B1) in the composition are not limited to the above-specified ranges.

Specifically, it is most preferable that (A3) epoxy compound having a softening point of 30° C. or less be contained in amount of 20-100 parts by weight, preferably 20-70 parts by weight, per 100 parts by weight of (A2) fluorene epoxy compound, and that (B1) thiol compound be contained so that thiol group is contained in an amount of 0.9-1.1 moles per 1 mole of epoxy group contained in the composition.

(C) Curing Promoter

The first epoxy polymerizable composition may contain (C) curing promoter. Examples thereof include imidazole compounds and amine compounds. Examples of imidazole compounds include 2-ethyl-4-methylimidazole. Examples of amine compounds include tris(dimethylaminomethyl)phenol. (C) Curing promoter may be a Lewis base compound.

It is preferable that the first epoxy polymerizable composition have a (C) curing promoter content of 0.1-5 parts by weight per 100 parts by weight of (A2) fluorene epoxy compound plus (A3) epoxy compound having a softening point of 30° C. or less. In this way the epoxy polymerizable composition shows a good balance between curability and storage stability.

(D) Silane Coupling Agent

The first epoxy polymerizable composition may contain (D) silane coupling agent. Epoxy polymerizable compositions containing (D) silane coupling agent exhibit high adhesion to substrates when employed as organic EL sealant compositions. Examples of (D) silane coupling agent include silane compounds having reactive groups such as epoxy group, carboxyl group, methacryloyl group or isocyanate group. Examples of silane compounds include trimethoxysilyl benzoate, γ-methacryloxypropyl trimethoxysilane, vinyltriacetoxysilane, γ-isocyanatopropyl triethoxysilane, γ-glycidoxypropyl trimethoxysilane, and β-(3,4-epoxycyclohexyl)ethyltrimethoxysilane. These silane coupling agents can be used alone or in combination.

The (D) silane coupling agent content in the first epoxy polymerizable composition is preferably 0.05-30 parts by weight per 100 parts by weight of the epoxy polymerizable composition, more preferably 0.3-20 parts by weight, most preferably 0.1-10 parts by weight.

(E) Additional Optional Component

The first epoxy polymerizable composition may further contain additional optional component(s) such as other resin components, fillers, modifiers, and stabilizers in such amounts that do not affect the effect of the present invention.

Examples of other resin components include polyamides, polyamideimides, polyurethanes, polybutadienes, polychloroprenes, polyethers, polyesters, styrene-butadiene-styrene block copolymers, petroleum resins, xylene resins, ketone resins, cellulose resins, fluorine oligomers, silicon oligomers, and polysulfide oligomers. These components can be added alone or in combination.

Examples of fillers include glass beads, styrene polymer particles, methacrylate polymer particles, ethylene polymer particles, and propylene polymer particles, These fillers may be used in combination.

Examples of modifiers include polymerization initiators, antiaging agents, leveling agents, wettability improvers, surfactants, and plasticizers. These modifiers may be used in combinationi. Examples of stabilizers include UV absorbers, antiseptic agents, and antibacterial agents. The modifiers may be used in combination.

[Physical Properties of Epoxy Polymerizable Composition]

Preferably, the first epoxy polymerizable composition can be rapidly cured in order to increase its workability upon sealing of members such as organic EL devices. As used herein, "can be rapidly cured" means that the epoxy polymerizable composition cures within 120 minutes under heated condition (up to 100° C.), for example.

Whether or not the epoxy polymerizable composition has been cured can be determined by confirming, by touching with a finger, whether or not the composition cured on a hot plate has been gelled. Alternatively, this can be achieved based on the epoxy conversion ratio, which can be measured based on the exothermic peaks of DSC curves of the epoxy polymerizable composition as measured before and after curing treatment. However, whether or not the epoxy polymerizable composition has been cured can be determined easily by confirming the occurrence of gellation by touching with a finger.

The curability of the first epoxy polymerizable composition can be controlled for instance by changing the proportions of (A2) fluorene epoxy compound, (A3) epoxy compound having a softening point of 30° C. or less and (B1) thiol compound and, where necessary, by changing the amount of (C) curing promoter.

The first epoxy polymerizable composition preferably has a viscosity at 25° C. of 0.1-100 Pa·s, more preferably 0.2-70 Pa·s, further preferably 0.5-40 Pa·s, most preferably 1-10 Pa·s. Epoxy polymerizable compositions having a viscosity falling within these ranges exhibit excellent workability. Viscosity at 25° C. is measured with an E-type viscometer (RC-500, Toki Sangyo Co., Ltd.).

The first epoxy polymerizable composition preferably has low curing shrinkage, which is preferably 10% or less, more preferably 8% or less. Curing shrinkage is obtained by substituting the value of the specific gravity of the composition before curing and the value of the specific gravity of the cured article into the following equation.

Curing shrinkage(%)=(specific gravity of cured article−specific gravity of composition before curing)/(specific gravity of cured article)×100

[Physical Properties of Cured Article]

The cured article of the first epoxy polymerizable composition preferably has a refraction index of greater than 1.60, more preferably 1.64 or more. Herein, refraction index measurements are taken at sodium D line with a wavelength of 589 nm. These indices can be measured with any known method, typically by the critical angle method with an Abbe refractometer.

This requirement is particularly aimed at improving the light extraction efficiency from organic EL devices when the epoxy polymerizable composition has been used as a sealant for the organic EL devices. Specifically, because top emission organic EL devices include above their organic EL layers transparent cathode layers which have a refraction index of about 1.8, the light extraction efficiency from the organic El devices decreases if the refraction index of the sealant placed above the cathode layers is too low.

The cured article of the epoxy polymerizable composition is preferably transparent in the visible light range. Transparency can be evaluated by measuring the light beam transmittance using a ultraviolet-visible spectrophotometer. The cured article according to the present invention preferably has a light beam transmittance of 90% or more at 450 nm in order that optical devices, including organic EL devices, which contain the cured article as a sealant, show excellent display performance.

Since the cured article of the first epoxy polymerizable composition according to the present invention contains a fluorene epoxy compound, it has a high refraction index. Moreover, since the first epoxy polymerizable composition contains (A3) epoxy compound having a softening point of 30° C. or less, (A2) fluorene epoxy compound, which has a relatively high softening point, and (A3) epoxy compound may be homogeneously miscible with one another, and the mixture exhibits fluidity even at 30° C. or less. Further, the epoxy compounds can be mixed with thiol compound even at 30° C. or less. Thus, the epoxy polymerizable composition never undergoes curing reactions upon mixing and therefore exhibits excellent workability at room temperature.

Resin compositions containing a bisphenol epoxy compound as (A3) epoxy compound having a softening point of 30° C. or less rapidly cure. Thus, when such resin compositions are used as sealants for organic EL devices, the time during which non-cured compounds contact the organic EL devices becomes so short that device contamination can be avoided.

A second epoxy polymerizable composition of the present invention will be described. The second epoxy polymerizable composition may become a cured article having a particularly high refraction index and particularly low moisture permeability.

The second epoxy polymerizable composition contains (A1) epoxy compound having two or more epoxy groups in the molecule, (B2) thiol compound having four or more thiol groups in the molecule, and (C) curing promoter, and may further contain additional optional components. Examples of optional components include (D) silane coupling agent described above.

(A1) Epoxy Compound (A1) Epoxy compound contained in the second epoxy polymerizable composition has two or more epoxy groups in the molecule and can crosslink and cure by reaction with (B2) thiol compound.

Some or all molecules of (A1) epoxy compound may be replaced by (A2) fluorene epoxy compound having a fluorene skeleton in the molecular structure. Examples of (A2) fluorene epoxy compound include compounds having the above general formula (1) and (2).

Some or all molecules of (A1) epoxy compound contained in the second epoxy polymerizable composition may be replaced by (A3) epoxy composition having a softening point of 30° C. or less (preferably 25° C. or less). Examples of (A3) epoxy compound having a softening point of 30° C. or less (preferably 25° C. or less) include bisphenol epoxy compounds having the above general formula (3).

The second epoxy polymerizable composition preferably contains an epoxy compound having a softening point of 30° C. or less in order to exhibit fluidity at room temperature.

(B2) Thiol Compound (B2) Thiol compound contained in the second epoxy polymerizable composition is characterized by having four or more thiol groups in one molecule. (B2) Thiol compound may acts as a curing agent for (A1) epoxy compound. Specifically, thiol groups of (B2) thiol compound react with epoxy groups of (A1) epoxy compound, allowing molecules of (A1) epoxy compound to crosslink to give a cured article having high heat resistance and high adhesion. Because (B2) thiol compound has four or more thiol groups in one molecule, it increases the crosslink density of the cured epoxy resin as well as reduces moisture permeability.

(B2) Thiol compound has a thiol equivalent weight of 80-100 g/eq, preferably 85-95 g/eq, more preferably 86-92 g/eq. (B2) Thiol compound preferably has a molecular weight of 140-500 as with (B1) thiol compound described above.

Specific examples of (B2) thiol compound include compounds having the above formulas (5) and (6). (B2) Thiol compound may, of course, have 5 or more thiol groups.

(C) Curing Promoter (C) Curing promoter contained in the second epoxy polymerizable composition adjusts the balance between curability and storage stability of the epoxy polymerizable composition. Examples of (C) curing promoter include those similar to examples of the above-described (C) curing agent.

(D) Silane Coupling Agent

The second epoxy polymerizable composition may contain (D) silane coupling agent. Examples of (D) silane coupling agent include those similar to examples of the above-described (D) silane coupling agent.

The (A1) epoxy compound content in the second epoxy polymerizable composition is preferably 100-300 parts by weight per 100 parts by weight of (B2) thiol compound. Further, the second epoxy polymerizable composition preferably contains 20-100 parts by weight (preferably 20-70 parts by weight) of (A3) epoxy compound having a softening point of 30° C. or less per 100 parts by weight of (A2) fluorene epoxy compound, in order to keep the composition's viscosity at appropriate level.

The (C) curing agent content in the second epoxy polymerizable composition is preferably 0.02-40 parts by weight per 100 parts by weight of (B2) thiol compound. Moreover, the (C) curing agent content is preferably 0.1-5 parts by weight per 100 parts by weight of (B2) thiol compound plus (A1) epoxy compound.

The (D) silane coupling agent content in the second epoxy polymerizable composition is preferably 0.02-40 parts by weight per 100 parts by weight of (B2) thiol compound. Further, the (D) silane coupling agent content is preferably 0.05-30 parts by weight per 100 parts by weight of (B2) thiol compound, more preferably 0.1-20 parts by weight, most preferably 0.3-10 parts by weight.

(E) Additional Optional Component

The second epoxy polymerizable composition may further contain optional components such as other resins, fillers, modifiers and stabilizers in amounts that do not affect the effects of the present invention. Specific examples of optional components such as other resins, fillers, modifiers and stabilizers, and their proportions in the epoxy polymerizable composition are similar to those described above.

[Physical Properties of Epoxy Polymerizable Composition]

Preferably, the second epoxy polymerizable composition can be rapidly cured as can the first epoxy polymerizable composition. The curability of the second epoxy polymerizable composition can be controlled for instance by adjusting the ratio between (A1) epoxy compound and (B2) thiol compound or adjusting (C) curing promoter content.

The second epoxy polymerizable composition preferably has a viscosity at 25° C. of 0.1-100 Pa·s.

The curability and viscosity of the second epoxy polymerizable composition can be measured in the same manner as described for the first epoxy polymerizable composition.

The cured article of the second epoxy polymerizable composition preferably has a high refraction index of greater than 1.60, more preferably 1.64 or greater, as with the first epoxy polymerizable composition. Moreover, the cured article preferably has a high light beam transmittance of 90% or more at 450 nm, as with the cured article of the first epoxy polymerizable composition. The cured article of the second epoxy polymerizable composition preferably has curing shrinkage of 10% or less, more preferably 8% or less, as with the cured article of the first epoxy polymerizable composition. The refraction index, light beam transmittance and curing shrinkage can be measured in the same manner as described above.

The moisture permeability of a 100 μm-thick cured article, as measured in accordance with JIS Z0208 at 60° C. at 90% RH, is preferably 20 $g/m^2/24$ h or less, more preferably 15 $g/m^2/24$ h or less.

As described above, the second epoxy polymerizable composition contains a thiol compound having four or more thiol groups in one molecule. Thus, the second epoxy polymerizable composition provides a cured article which has a high crosslink density and is less permeable to moisture and the like. Furthermore, the second epoxy polymerizable composition provides a cured article having a high refraction index as it contains a fluorene epoxy compound as an epoxy compound.

2. Production Method of Epoxy Polymerizable Composition

Epoxy polymerizable compositions of the present invention may be produced by any method as long as the effects of the present invention are not impaired. For example, an epoxy polymerizable composition is produced by the method including the steps of 1) providing (A) epoxy compound, and 2) mixing (A) epoxy compound and (B) thiol compound at temperature where no curing reactions occur. Mixing can be accomplished by stirring these components in a flask; kneading them using a three roll mill; or the like.

An epoxy polymerizable composition which additionally contains (C) curing promoter or (E) additional optional component is produced by the method which further includes, after step (2), the step of 3) mixing the epoxy and thiol compounds with (C) curing promoter or 4) mixing the epoxy and thiol compounds with (E) additional optional component, In step (1), epoxy compounds are preferably mixed under heating condition (e.g., 60° C. or higher) in cases where (A) epoxy compound includes a large amount of epoxy compound having a high softening point (e.g., fluorene epoxy compound having a softening point of 50° C. or greater).

In step (2), (A) epoxy compound and (B) thiol compound are preferably mixed under non-heating condition (e.g., 30° C. or less) to prevent curing reaction progression (e.g., gellation). For the same reason, (C) curing promoter is preferably mixed at 30° C. or less.

Thus, when (A) epoxy compound includes (A3) epoxy compound having a softening point of 30° C. or less, it desirably facilitates mixing with (B) thiol compound under non-heating condition.

3. Applications of Cured Article

By curing epoxy polymerizable compositions of the present invention, they may be particularly used as sealants, preferably as sealants or optical materials through which light from optical devices pass. Examples of sealants include sealants for organic EL panels, liquid crystal displays, LEDs, electronic papers, solar cells, and CCDs. Examples of optical materials include optical adhesives, optical films, hologram materials, photonic crystals, diffraction gratings, prisms, gradient index lenses, optical fibers, and optical waveguide films.

Epoxy polymerizable compositions of the present invention are preferably used as sealant compositions (or transparent resin compositions for optical materials) from which sealants for luminescent devices and the like (particularly top emission organic EL devices) are made.

4. Organic EL

As described above, sealant compositions of the present invention are useful as compositions for producing sealing materials for top emission organic EL devices. An organic EL panel of the present invention includes a display substrate having organic EL devices arranged thereon; a counter substrate which pairs with the display substrate; and a sealing material for sealing the organic E1 devices, which is provided between the display substrate and counter substrate. As described above, an organic EL panel in which a sealing member is provided at the periphery of the counter substrate is referred to as a "frame-sealed organic EL panel." On the other hand, an organic EL panel in which a sealing member fills the space between the organic EL devices and counter substrate is referred to as a "cover-sealed organic EL panel." Because cured articles of sealant compositions of the present invention exhibit high refraction indices, they are particularly suitable for production of sealing members for cover sealing of top emission organic EL panels.

The drawing is a sectional view schematically showing a cover-sealed top emission organic EL device. In the drawing, reference numeral 1 denotes a sealing member; 20 denotes a organic EL layer; 21 denotes a transparent cathode layer made of ITO, IZO or the like; 22 denotes a reflective anode layer made of aluminum, silver or the like; 30 denotes a display substrate; and 31 denotes a counter substrate (sealing plate). The substrates are generally made of glass. In the organic EL panel of the present invention, sealing member 1 in the drawing is a cured article of the sealant composition. Moreover, transparent cathode layer 21 may be covered with a protection layer (not shown) made of silicon oxide, silicon nitride or the like.

An organic EL panel which includes a sealing member formed of a cured article of a sealant composition of the present invention (hereinafter also referred to as a "organic EL panel of the present invention") may be manufactured with any method. For example, an organic EL panel of the present invention may be manufactured by the method which includes the steps of 1) applying a sealant composition onto a display substrate having organic EL devices arranged thereon; 2) placing a counter substrate (sealing plate) over the display substrate coated with the sealant composition to form a laminate; and 3) curing the sealant composition in the laminate thus formed. Each step may be carried out in accordance with a known method. Examples of application methods of the sealant composition include screen printing and dispensing method. The curing step is preferably carried out at 25-100° C. for 0.1-2 hours.

Alternatively, an organic EL panel of the present invention may be manufactured by the method which includes the steps of 1) forming a laminate of a display substrate having organic EL devices arranged thereon, a spacer, and a counter substrate (sealing plate) which pairs with the display substrate; 2) applying a sealant composition into the space formed between the display substrate and counter substrate in the laminate; and 3) curing the loaded sealant composition.

EXAMPLES

Hereinafter, the present invention will be described in detail with reference to Examples and Comparative Examples, which however shall not be construed as limiting the scope of the invention thereto. Firstly, components employed in Examples and Comparative Examples will be described.

(A) Epoxy Compounds

Fluorene Epoxy Compound

PG100 (Osaka Gas Chemicals Co., Ltd.)

This compound has the following formula (7), and determined to have a softening point of 91.5° C. and an epoxy value of 3.89 eq/kg (epoxy equivalent weight of 257 g/eq).

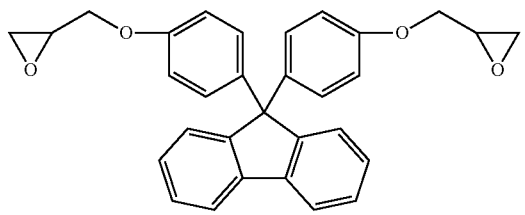

(7)

EG210 (Osaka Gas Chemicals Co., Ltd.)

This compound was determined to have a softening point of 50° C. and an epoxy value of 3.26 eq/kg (epoxy equivalent weight of 307 g/eq).

Bisphenol Epoxy Compound

YL-983U (Japan Epoxy Resins Co., Ltd.)

This compound is a bisphenol F epoxy compound, which is liquid at room temperature and determined to have an epoxy equivalent weight of 169 g/eq.

(B) Thiol Compound

GST (Mitsui Chemicals Co., Ltd.)

This compound has the following formula (4) The compound has a molecular weight of 260. The compound has three thiol groups in one molecule and thus has a thiol equivalent weight of 86.7 g/eq. Sulfur content is 61.5%.

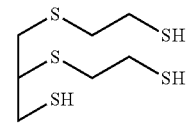

(4)

1,1,3,3-tetrakis(mercaptomethylthio)propane (Mitsui Chemicals Co., Ltd.)

This compound has the following formula (6) and is described in JP-B No. 3995427. The compound has a molecular weight of 356. The compound has four thiol groups in one molecule and thus has a thiol equivalent weight of 89.0 g/eq. Sulfur content is 71.9%.

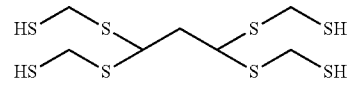

(6)

FSH (Mitsui Chemicals Co., Ltd.)

This compound has the following formula (5) and is described in JP-B No. 3444682. The compound has a molecular weight of 366. The compound has four thiol groups in one molecule and thus has a thiol equivalent weight of 91.5 g/eq. Sulfur content is 61.2%.

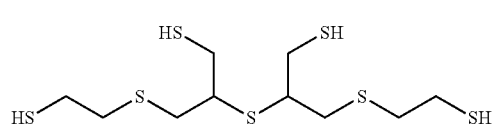

(5)

(C) Curing Promoter

2E4MZ (2-ethyl-4-methylimidazole) (Shikoku Chemicals Corporation)

jERCURE 3010 (trisdimethylaminomethylphenol) (Japan Epoxy Resins Co., Ltd.)

Example 1

50 parts by weight of YL-983U and 50 parts by weight of PG-100 were placed in a flask and mixed under heating. The flask was then charged with 44.2 parts by weight of a compound having formula (4) (hereinafter designated as "GST") followed by mixing at room temperature. Adding 2.0 parts by weight of 2E4MZ, the mixture was stirred at room temperature to produce an epoxy polymerizable composition.

Examples 2-8

Epoxy polymerizable compositions of Examples 2-8 were prepared under the same condition as in Example 1 by mixing components in proportions (by weight) shown in Table 1. In the epoxy polymerizable composition of Example 6, the ratio of epoxy equivalent weight to thiol equivalent was 1:0.8. In the epoxy polymerizable composition of Example 7, the ratio of epoxy equivalent weight to thiol equivalent was 1:1.2.

Comparative Example 1

100 parts by weight of YL-983U and 51 parts by weight of GST were placed in a flask and stirred at room temperature to produce an epoxy polymerizable composition.

Comparative Example 2

2 parts by weight of jERCURE 3010 was mixed with the epoxy polymerizable composition prepared in Comparative Example 1 under the same condition as in Example 1 to produce an epoxy polymerizable composition.

Comparative Example 3

100 parts by weight of PG100, 38 parts by weight of GST, and 2 parts by weight of 2E4MZ were mixed under the same condition as in Example 1 to produce an epoxy polymerizable composition.

Comparative Example 4

100 parts by weight of EG210, 32 parts by weight of GST, and 2 parts by weight of 2E4MZ were mixed under the same condition as in Example 1 to produce an epoxy polymerizable composition.

The epoxy polymerizable compositions prepared in Examples and Comparative Examples were evaluated for their physical properties as follows.

(1) Solubility

Epoxy polymerizable compositions which formed clear homogeneous solution were ranked "○", and epoxy polymerizable compositions which formed unclear solution (e.g., clouded solution) were ranked "x".

(2) Curability

The epoxy polymerizable compositions were allowed to stand at room temperature (25° C.) for a certain period of time. The compositions were then checked for their gel state by touching with a finger, measuring the time it took for the composition to be gelled (curing time). In a similar way, the epoxy polymerizable compositions were heated to 80° C., and curing time at 80° C. was measured. Epoxy polymerizable compositions which showed curing time of not greater than 30 minutes were ranked "○", and those showed curing time of not less than 30 minutes were ranked "x".

(3) Viscosity

The epoxy polymerizable compositions were measured for their viscosity (25° C.) with an E-type viscometer (DII-III Ultra Rheometer, BROOKFIELD).

(4) Refraction Index of Cured Article

The epoxy polymerizable compositions were injected into a mold and heated at 80° C. for 2 hours to produce 0.2 mm-thick cured articles, which were then measured for their refraction index with a refractometer (Multi-Wavelength Abbe Refractometer DR-M4, ATAGO Co., Ltd.). Measurements were taken at sodium D line with a wavelength of 589 nm.

(5) Light Beam Transmittance

The cured articles prepared above were measured for their light bean transmittance at 450 nm with a ultraviolet-visible spectrophotometer (MULTISPEC-1500, Shimadzu Corporation).

(6) Glass Transition Temperature Tg

The cured articles prepared above were measured for their linear expansion coefficient at a heating rate of 5° C./min with a thermomechanical analyzer (TMA/SS6000, Seiko Instruments Inc.), determining values of Tg from the inflection points.

(7) Curing Shrinkage

The epoxy polymerizable compositions were measured for their curing shrinkage by substituting their specific gravity before cured and the specific gravity after cured into the following equation.

Curing shrinkage(%)=(specific gravity of cured article−specific gravity of composition before curing)/(specific gravity of cured article)×100

(8) Moisture Permeability

100 μm-thick cured articles were prepared in the same manner as described above and measured for their moisture permeability in accordance with JIS Z0208 at 60° C. at 90% RH.

Evaluations of the epoxy polymerizable compositions of Examples 1-8 and their cured articles are shown in Table 1 in Evaluations of the epoxy polymerizable compositions of Comparative Examples 1-4 and their cured articles are shown in Table 2.

TABLE 1

| | | | | | | | | | | | | (unit: parts by weight) |
|---|---|---|---|---|---|---|---|---|---|---|---|---|
| | Examples | | | | | | | | | | | |
| | 1 | 2 | 3 | 4 | 5 | 6 | 7 | 8 | 9 | 10 | 11 | 12 |
| Composition | | | | | | | | | | | | |
| (A2) PG-100 | 50 | — | 50 | — | — | 50 | 50 | 50 | 86 | 0 | 107 | 107 |
| (A2) EG-210 | — | 30 | — | 50 | 70 | — | — | — | — | — | — | — |

TABLE 1-continued (unit: parts by weight)

| | Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| (A3) YL-983U | 50 | 70 | 50 | 50 | 30 | 50 | 50 | 50 | 128 | 185 | 107 | 107 |
| (B1) GST | 44.2 | 35.7 | 44.2 | 41.2 | 37.3 | 35.4 | 53 | 44.2 | — | — | — | — |
| (B2) 1,1,3,3-tetrakis (mercaptomethylthio)propane | — | — | — | — | — | — | — | — | 100 | 100 | — | — |
| (B2) FSH | — | — | — | — | — | — | — | — | — | — | 100 | 100 |
| (C) 2E4MZ | 2 | — | — | — | 2 | 2 | 2 | 1 | 0.5 | 2 | 2 | 1 |
| (C) jERCURE 3010 | — | 2 | 2 | 2 | — | — | — | — | — | — | — | — |
| Thiol equivalent weight (g/eq) of (B) component | 86.7 | 86.7 | 86.7 | 86.7 | 86.7 | 86.7 | 86.7 | 86.7 | 89 | 89 | 91.5 | 91.5 |
| Physical properties | | | | | | | | | | | | |
| Solubility | ○ | ○ | ○ | ○ | ○ | ○ | ○ | ○ | — | — | — | — |
| Viscosity (Pa · S) | 5 | 2 | 5 | 3 | 5 | 5 | 4 | 5 | 34 | 6 | 31 | 31 |
| Curability (@80° C.) | ○ | ○ | ○ | ○ | ○ | ○ | ○ | ○ | — | — | — | — |
| Light beam transmittance (%) | 90 | 90 | 90 | 90 | 90 | 90 | 90 | 90 | — | — | — | — |
| Refraction index nD (%) | 1.65 | 1.64 | 1.66 | 1.64 | 1.64 | 1.65 | 1.65 | 1.65 | 1.66 | 1.64 | 1.66 | 1.66 |
| Tg (° C.) | 61 | 41 | 61 | 40 | 36 | 82 | 40 | 64 | 67.4 | 66.4 | 62.9 | 73.5 |
| Curing shrinkage (%) | 7 | 7 | 7 | 7 | 7 | 7 | 7 | 7 | — | — | — | — |
| Moisture permeability (g/m$^2$/24 h) | 45 | 50 | 45 | 50 | 60 | 45 | 45 | 45 | 12 | 14 | 18 | 18 |

TABLE 2

(unit: parts by weight)

| | Comparative Examples | | | | |
|---|---|---|---|---|---|
| | 1 | 2 | 3 | 4 | 5 |
| Composition | | | | | |
| (A2) PG-100 | — | — | 100 | — | 0 |
| (A2) EG-210 | — | — | — | 100 | — |
| (A3) YL-983U | 100 | 100 | — | — | 185 |
| (B1) GST | 51 | 51 | 38 | 32 | 100 |
| (B2) 1,1,3,3-tetrakis (mercaptomethylthio)propane | — | — | — | — | — |
| (B2) FSH | — | — | — | — | — |
| (C) 2E4MZ | — | — | 2 | 2 | 1.9 |
| (C) jERCURE 3010 | — | 2 | — | — | — |
| Thiol equivalent weight (g/eq) of (B) component | 86.7 | 86.7 | 86.7 | 86.7 | 86.7 |
| Physical properties | | | | | |
| Solubility | ○ | ○ | X | X | — |
| Viscosity (Pa · s) | 1 | 1 | — | — | 3 |
| Curability (@80° C.) | X | ○ | — | — | — |
| Light beam transmittance (%) | — | 90 | — | — | — |
| Refraction index nD (%) | — | 1.63 | — | — | 1.63 |
| Tg (° C.) | — | 46 | — | — | 37.4 |
| Curing shrinkage (%) | — | 7 | — | — | — |
| Moisture permeability (g/m$^2$/24 h) | — | 50 | — | — | 83 |

As shown in Table 1, cured articles of Examples 1-8 (cured articles of first epoxy polymerizable compositions of the present invention) exhibited refraction indices as high as 1.64 or greater, with excellent heat resistance and low curing shrinkage. The epoxy polymerizable compositions of Examples 1-8 also exhibited good solubilities because their viscosity falls within an appropriate range at room temperature. Further, the epoxy polymerizable compositions exhibited excellent curability. In particular, the epoxy polymerizable compositions of Examples 1, 3 and 6-8 exhibited appropriate viscosities and their cured articles exhibited extremely high refraction indices of 1.65 or greater.

By contrast, the cured article of Comparative Example 2 exhibited a refraction index as low as 1.63, as shown in Table 2. The composition of Comparative Example 1 failed to be cured due to the absence of a curing promoter. The compositions of Comparative Examples 3 and 4 exhibited high viscosities at room temperature and therefore low solubilities due to the absence of a bisphenol epoxy compound; evaluations of curability, etc., were impossible.

Example 9

128 parts by weight of YL-938U and 86 parts by weight of PG-100 were placed in a flask and mixed at 90-100° C. for 1 hour. 100 parts by weight of 1,1,3,3-tetrakis(mercaptomethylthio)propane was added and mixed at room temperature for 1 hour. Further, 0.5 parts by weight of 2E4MZ was added and stirred at room temperature for 5 minutes to produce an epoxy polymerizable composition.

Examples 10-12

Epoxy polymerizable compositions were prepared in the same manner as in Example 9 by mixing (A1) epoxy compound, (B2) thiol compound having four thiol groups in the molecule and (C) curing promoter in the proportions (by weight) shown in Table 1.

Comparative Example 5

An epoxy polymerizable composition was prepared in the same manner as in Example 9 by mixing (A1) epoxy compound, (B1) thiol compound having three thiol groups in the molecule and (C) curing promoter in the proportions (by weight) shown in Table 2.

The epoxy polymerizable compositions prepared in Examples and Comparative Examples were evaluated for their (3) viscosity, (4) cured article's refraction index, (6) cured article's glass transition temperature (Tg), and (8) cured article's moisture permeability in the same manner as descried above. The results are shown in Table 1 and Table 2.

As shown in Table 1, while the cured articles of Examples 9-12 exhibited limited moisture permeabilities ranging from 12-18 g/m$^2$/24 h, the cured articles of Comparative Example 5 and Example 1 exhibited higher moisture permeabilities than those of Examples 9-12. This may be attributed to the difference in the number of thiol groups in the thiol compound. Namely, because the cured articles of Examples 9-12 have a large number of thiol groups compared to those of Example 1 and Comparative Example 5, the thiol groups are considered to have contributed to the reduction in moisture permeability by increasing the crosslink density of the cured articles.

While the cured articles prepared in Examples 9, 11 and 12 had refraction indices of 1.66, the cured article prepared in Example 10 had a refraction index of 1.64. Thus, it is possible to enhance the cured article's refraction index by employing epoxy compounds having a fluorene skeleton.

The present application claims the priorities of Japanese Patent Application No. 2008-015550 filed on Jan. 25, 2008 and Japanese Patent Application No. 2008-100355 filed on Apr. 8, 2008, the entire contents of which are herein incorporated by reference.

INDUSTRIAL APPLICABILITY

By employing cured articles of first epoxy polymerizable compositions of the present invention as cover-sealing sealants for organic EL devices, particularly for top emission organic EL devices, it is possible to increase light extraction efficiency. Further, productivity of organic EL panels may be increased because the first epoxy polyermizable compositions exhibit good workability.

Moreover, by employing cured articles of second epoxy polymerizable compositions of the present invention as cover-sealing sealants particularly for top emission organic EL devices, it is possible to reduce permeability for moisture and the like as well as to enhance light extraction efficiency.

EXPLANATION OF REFERENCE NUMERALS

1 . . . Sealant
20 . . . Organic EL layer
21 . . . Transparent cathode layer
22 . . . Reflective anode layer
30 . . . Substrate
31 . . . Sealing plate

The invention claimed is:

1. A sealant in an optical device comprising an epoxy polymerizable composition comprising:
   (A2) fluorene epoxy compound having the following general formula (1) or (2);
   (A3) epoxy compound having a softening point of 30° C. or less; and
   (B1) thiol compound containing a compound represented by formula (4),
   wherein a mole ratio of thiol groups to epoxy groups contained in the epoxy polymerizable composition is in a range of 0.9-1.1:1,

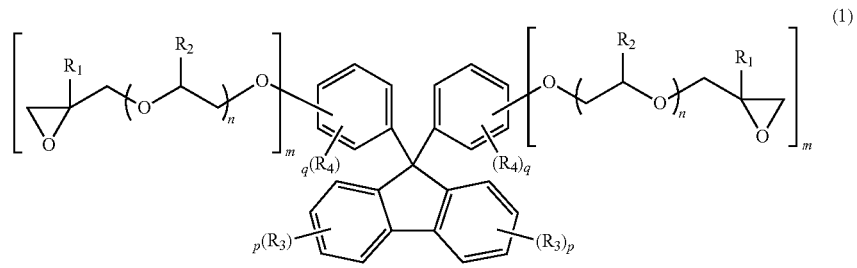

(1)

where $R_1$'s independently represent hydrogen atom or methyl group; $R_2$'s independently represent hydrogen atom or methyl group; $R_3$'s independently represent alkyl group having 1-5 carbon atoms; $R_4$'s independently represent alkyl group having 1-5 carbon atoms; n's independently represent an integer of 0-3 ; m's independently represent an integer of 1-3; p's independently represent an integer of 0-4; and q's independently represent an integer of 0-4,

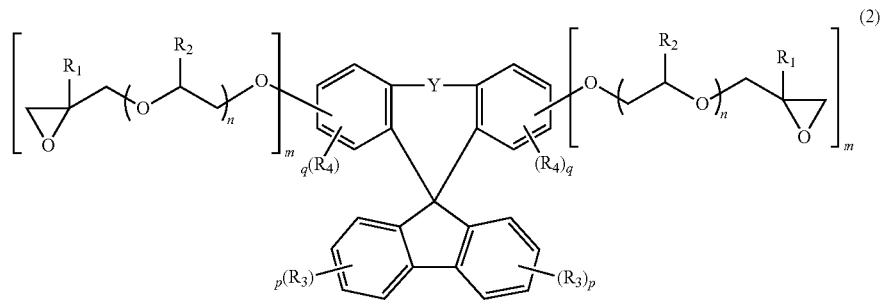

(2)

where Y represents single bond, oxygen atom or sulfur atom; and $R_1$-$R_4$, m, n, p and q are defined the same as those of general formula (1),

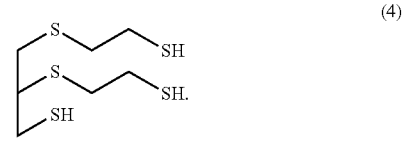

(4)

2. The sealant according to claim 1, wherein the epoxy polymerizable composition has a viscosity 25° C. of 0.1-100 Pa·s, as measured with an E-type viscometer.

3. The sealant according to claim 1, wherein (A3) epoxy compound is a bisphenol epoxy compound.

4. The sealant according to claim 1, wherein (A3) epoxy compound is contained in an amount of 20-70 parts by weight per 100 parts by weight of (A2) fluorene epoxy compound.

5. A cured article formed by curing the sealant according to claim 1.

6. The cured article according to claim 5, wherein the cured article has a refraction index of 1.64 or greater.

7. An optical device comprising the cured article according to claim 5.

8. An organic EL(electroluminescent) panel comprising:
a display substrate having organic EL devices arranged thereon;
a counter substrate which pairs with the display substrate; and
a sealant which is provided between the display substrate and the counter substrate and fills a space formed between the organic EL devices and the counter substrate,
wherein the sealant is the cured article according to claim 6.

9. The organic EL panel according to claim 8, wherein the organic EL devices are top emission organic EL devices.

10. The sealant according to claim 1, wherein a transmittance of light having a wavelength of 450 nm through a 0.2 mm cured article of the epoxy polymerizable composition is 90% or more.

11. The cured article according to claim 5, wherein the cured article is a sealing member filling a space between an organic EL device and a counter substrate in an organic EL panel.

* * * * *